United States Patent [19]
Lee et al.

[11] Patent Number: 5,300,816
[45] Date of Patent: Apr. 5, 1994

[54] SEMICONDUCTOR WAFER WITH IMPROVED STEP COVERAGE ALONG SCRIBE LINES

[75] Inventors: Jeungwoo Lee, Seoul; Myoungseob Shim, Suwon; Heonjong Shin, Seoul, all of Rep. of Korea

[73] Assignee: Samsung Electronics Co., Ltd., Suwon, Rep. of Korea

[21] Appl. No.: 904,613

[22] Filed: Jun. 26, 1992

[30] Foreign Application Priority Data

Jun. 27, 1991 [KR] Rep. of Korea .................. 91-10829

[51] Int. Cl.$^5$ ............... H01L 23/48; H01L 29/44; H01L 29/46
[52] U.S. Cl. ............... 257/797; 257/739; 257/758; 257/776
[58] Field of Search ............... 357/55, 40, 45, 68, 357/71; 437/226, 227; 257/618, 739, 758, 776, 797

[56] References Cited

U.S. PATENT DOCUMENTS

| | | | |
|---|---|---|---|
| 3,707,760 | 1/1973 | Citrin | 357/55 |
| 4,835,592 | 5/1989 | Zommer | 357/68 |
| 5,053,836 | 10/1991 | McClurg | 357/40 |

FOREIGN PATENT DOCUMENTS

0036137 5/1981 European Pat. Off. .

Primary Examiner—Ngan Ngo
Attorney, Agent, or Firm—Robert A. Westerlund; Charles R. Donohoe

[57] ABSTRACT

A semiconductor wafer partitioned into a multiplicity of chip areas defined by a grid-like array of scribe lines inscribed into the surface of the wafer, wherein each scribe line is longitudinally bounded by respective field oxide layers formed in the surface of the wafer, to thereby define a scribe line region between adjacent chip areas. The wafer includes a multiplicity of integrated circuits formed in a corresponding multiplicity of the chip areas, respectively, each of the integrated circuits including a patterned, multilayer structure having a peripheral edge portion which extends into a respective one of the scribe line regions, wherein the peripheral edge portion of each multilayer structure has a multi-tiered cross-sectional profile, thereby ensuring adequate step coverage of the photoresist film which is applied to the individual layers of the multilayer structures when they are patterned during the wafer fabrication process.

14 Claims, 3 Drawing Sheets

SEMICONDUCTOR WAFER WITH IMPROVED STEP COVERAGE ALONG SCRIBE LINES

BACKGROUND OF THE INVENTION

1. Field of the Invention

The present invention relates generally to semiconductor wafers and wafer fabrication, and more particularly, to a semiconductor wafer wherein step coverage along the scribe lines thereof is improved over that of the prior art.

2. Description of the Prior Art

In a semiconductor wafer fabrication process, a semiconductor wafer is partitioned into a multiplicity n of chip or die areas defined by a grid-like array of scribe lines which are inscribed into the surface of the wafer. Then, an identically patterned, multilayer structure is simultaneously fabricated in each of the chip areas, with the exception of a few test chip areas. Generally, each of these patterned multilayer structures constitutes a single, discrete semiconductor device or integrated circuit (I.C.). Ultimately, the wafer is sliced, e.g., by means of a diamond-tipped cutting tool, along the scribe lines, into a multiplicity n of individual I.C. chips or die.

In the fabrication of I.C.s having high levels of integration (e.g., VLSI), the number of patterned layers required to make the I.C.s is large, which occasions certain problems which complexify the wafer fabrication process and degrade wafer yield. More particularly, the peripheral edge portion of the patterned multilayer structure of each individual I.C. fabricated on the wafer, extends into the scribe line region between adjacent ones of the I.C.s. As part of the fabrication process, a sequence of photolithographic steps are performed in order to create the desired pattern in each of the individual layers of the eventual multilayer structure of each I.C. It is critical to the efficacy of this process that the photoresist film deposited on each layer to be patterned, be deposited evenly and uniformly, and at the proper thickness. However, when the number of individual layers to be patterned becomes too large, the height of the vertical steps formed at the peripheral edge of the patterned multilayer structure of each I.C. becomes so great as to cause thinning or attenuation of the photoresist film deposited thereover, a condition which is generally referred to an inadequate step coverage.

Such inadequate step coverage results in degradation of the electrical characteristics, performance, and reliability of the individual I.C.s fabricated in the wafer. Further, such inadequate step coverage causes an increase in the number of defective die per wafer, thereby lowering wafer yield. This problem of inadequate step coverage becomes more acute as the level of integration density of the I.C.s becomes greater, thereby resulting in increased height of the vertical steps formed at the peripheral edge of the patterned multilayer structure of each I.C., which, in turn, aggravates the problem of inadequate step coverage.

SUMMARY OF THE INVENTION

The present invention encompasses a semiconductor wafer partitioned into a multiplicity of chip areas defined by a grid-like array of scribe lines inscribed into the surface of the wafer, wherein each scribe line is longitudinally bounded by respective field oxide layers formed in the surface of the wafer, to thereby define a scribe line region between adjacent chip areas. The wafer includes a multiplicity of integrated circuits formed in a corresponding multiplicity of the chip areas, respectively, each of the integrated circuits including a patterned, multilayer structure having a peripheral edge portion which extends into a respective one of the scribe line regions, wherein the peripheral edge portion of each multilayer structure has a multi-tiered cross-sectional profile, thereby ensuring adequate step coverage of the photoresist film which is applied to the individual layers of the multilayer structures when they are patterned during the wafer fabrication process.

In a first preferred embodiment of the present invention, for each multilayer structure, the length of the peripheral edge portion of each individual layer is greater than that of the other ones of the individual layers disposed thereabove.

In a second preferred embodiment of the present invention, for each multilayer structure, the length of the peripheral edge portion of each individual layer is less than that of the other ones of the individual layers disposed thereabove.

In a third preferred embodiment of the present invention, each multilayer structure is comprised of a plurality of individual layers, including first alternate ones comprised of successive, alternate ones of the individual layers, beginning with the bottommost individual, and, second alternate ones comprised of successive, alternate ones of the individual layers, beginning with the next-to-bottommost individual layer. The length of the peripheral edge portion of each individual layer of the first alternate ones is greater than that of the other ones of the individual layers of the first alternate ones disposed thereabove. The length of the peripheral edge portion of each individual layer of the second alternate ones is less than that of the other ones of the individual layers of the second alternate ones disposed thereabove.

In a fourth preferred embodiment of the present invention, each multilayer structure is the same as in the third embodiment, except that the length of the peripheral edge portion of each individual layer of the first alternate ones is less than that of the other ones of the individual layers of the first alternate ones disposed thereabove, and, the length of the peripheral edge portion of each individual layer of the second alternate ones is greater than that of the other ones of the individual layers of the second alternate ones disposed thereabove.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
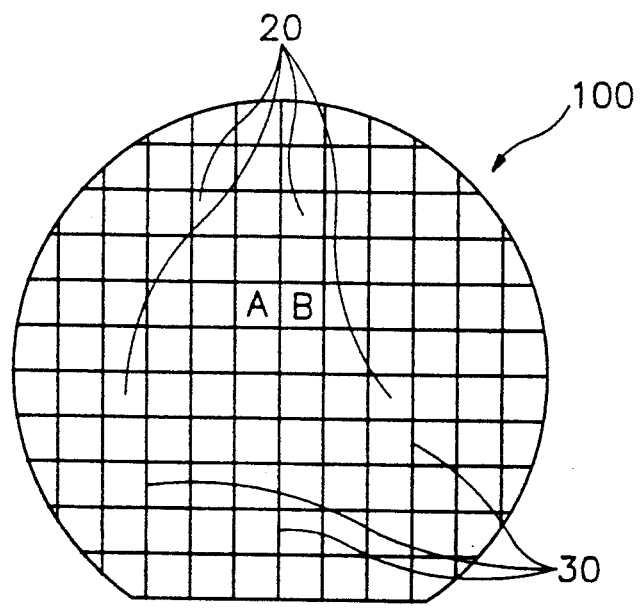
FIG. 1 is a diagrammatical plan view of a semiconductor wafer, which illustrates the basic layout used in the present invention.
Figure 1A:
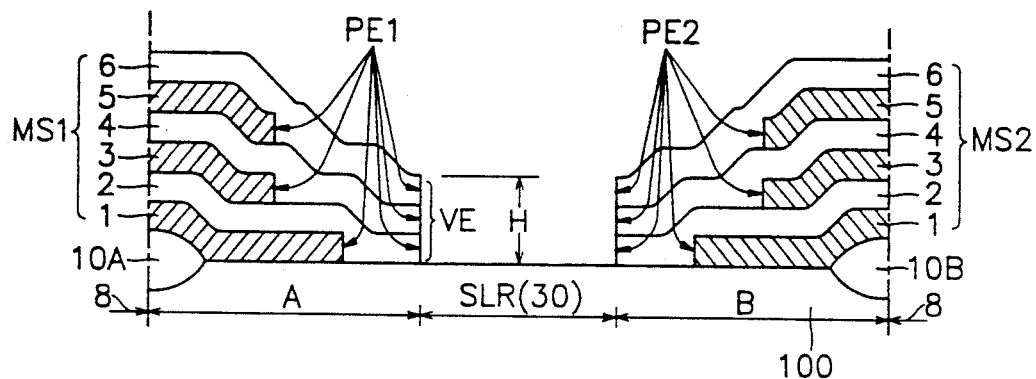
FIG. 1A is a fragmentary, cross-sectional view of the wafer illustrated in FIG. 1, depicting only peripheral edge portions of adjacent, patterned multilayer structures which extend into a scribe line region of the wafer which separates adjacent chip areas A, B, the multilayer structures being constructed in accordance with the prior art.
Figure 2:
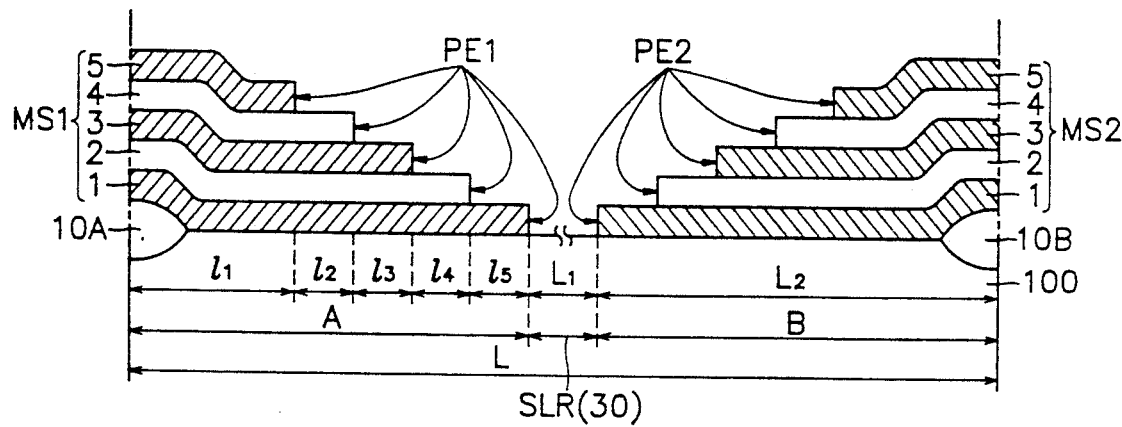
FIG. 2 depicts the same view shown in FIG. 1A, except that the multilayer structures are constructed in accordance with a first preferred embodiment of the present invention.
Figure 3:
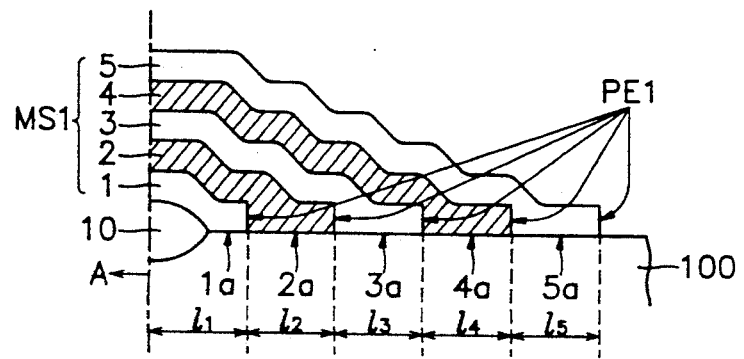
FIG. 3 depicts the same view shown in FIG. 1A, except that only the peripheral edge portion of one of the multilayer structures is shown therein, and that a multilayer structure is constructed in accordance with a second preferred embodiment of the present invention.
Figure 4:
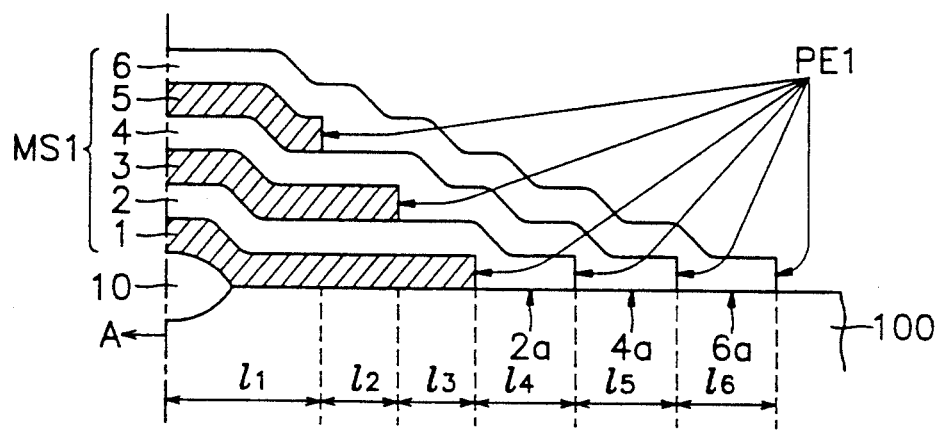
FIG. 4 depicts the same view shown in FIG. 3, except that the multilayer structure is constructed in accordance with a third preferred embodiment of the present invention; and, FIG. 5 depicts the same view shown in FIG. 3, except that the multilayer structure is constructed in accordance with a fourth preferred embodiment of the present invention.
Figure 5:
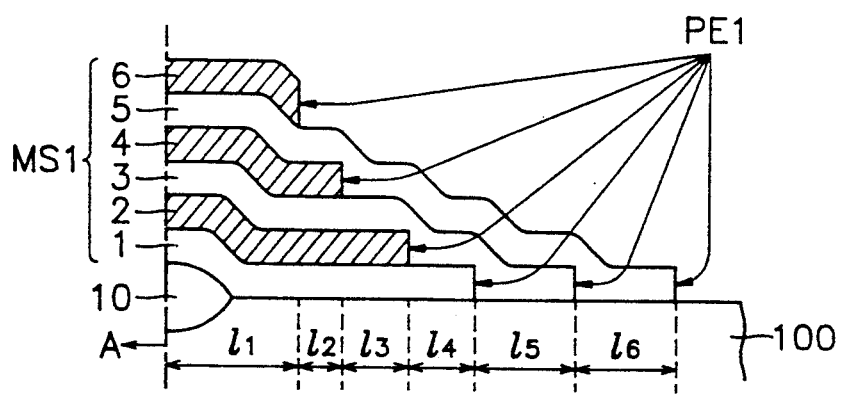

With reference now to FIG. 1, there can be seen a semiconductor wafer 100 which is partitioned into a multiplicity n of chip or die areas 20 defined by a grid-like array of scribe lines 30 which are inscribed into the surface of the wafer 100. The scribe lines 30 serve to separate the chip areas 20 from each other. Ultimately, the scribe lines 30 are sawed through in order to break the wafer 100 into a multiplicity n of individual chips or die. Thus, no circuitry is formed in the regions of the wafer 100 occupied by the scribe lines 30. In FIGS. 1A and 2, only a fragmentary, cross-sectional view of the wafer 100 is shown, illustrating only peripheral edge portions PE1, PE2 of adjacent, patterned multilayer structures MS1, MS2, respectively, which extend into a region SLR of the wafer 100 occupied by the scribe line 30 which separates adjacent chip areas A, B wherein the remaining portions of the multilayer structures MS1, MS2, respectively, are fabricated. FIGS. 3-5 depict the same type of view as is depicted in FIGS. 1A and 2, except that only the peripheral edge portion PE1 of one of the multilayer structures MS1 is shown therein, for sake of simplicity, although it will be readily appreciated that the peripheral edge portion PE2 of the adjacent, multilayer structure MS2 is the mirror image thereof.

With reference now to FIG. 1A, there can be seen the peripheral edge portions PE1, PE2 of adjacent, patterned multilayer structures MS1, MS2, respectively, which extend into the region SLR of the semiconductor wafer 100 defined by the scribe line 30 which separates the chip areas A, B from each other, the multilayer structure MS1, MS2 being constructed in accordance with the prior art. More particularly, each multilayer structures MS1, MS2 is shown to be comprised of six individual layers, 1-6. The peripheral edge portions of the even-numbered layers 2, 4, 6 of each multilayer structure MS1, MS2 are of the same length, and terminate in a common vertical plane. The peripheral edge portions of the odd-numbered layers 3 and 5 are of the same length, and the peripheral edge portion of the bottommost layer 1 is of greater length than that of the odd-numbered layers 3, 5 disposed thereabove. Because the lengths of the peripheral edge portions of the even-numbered layers are the same, and greater than that of the odd-numbered layers 1, 3, 5, the multilayer structures MS1, MS2 have a single vertical edge VE having a height H equal to the collective thicknesses of the even-numbered layers 2, 4, 6. As a consequence of the above-described prior art multilayer structure, the photoresist film (not shown) which is deposited thereover, during patterning of the individual layers, is susceptible to thinning or attenuation, thus resulting in inadequate step coverage and the adverse consequences occasioned thereby.

With reference now to FIG. 2, there can be seen a first embodiment of the present invention. More particularly, there can be seen the peripheral edge portions PE1, PE2 of adjacent, patterned multilayer structures MS1, MS2, respectively, which extend into the region SLR of the semiconductor wafer 100 defined by the scribe line 30 which separates the chip areas A, B from each other. The scribe line region SLR is longitudinally bounded by respective field oxide layers 10A, 10B formed in the wafer 100. The scribe line region SLR normally has a width of approximately 200 $\mu$m, although this is not limiting to the present invention.

As depicted in FIG. 2, each multilayer structure MS1, MS2, is comprised of five individual layers, consecutively numbered 1-5, respectively, from the bottommost layer 1 to the uppermost layer 5. It should be readily appreciated that the number and composition of the individual layers constituting each multilayer structure MS1, MS2 is not limiting to the present invention. For example, each of the individual layers 1-5 may conveniently be a wiring layer or an insulating layer. The nature and composition of each of these individual layers 1-5 is dictated by the design of the I.C.s to be fabricated on the wafer 100, and thus, is an independent design consideration which does not form a part of the present invention. As such, these layers 1-5 will be referred to generically hereinthroughout.

In accordance with the first preferred embodiment of the present invention depicted in FIG. 2, the peripheral edge portions PE1, PE2 of the multilayer structures MS1, MS2, respectively, are tiered, to thereby impart a staircase-shaped profile thereto. Preferably, as is shown in FIG. 2, the length of the peripheral edge portion PE1, PE2 of each individual layer 1-5 of each multilayer structure MS1, MS2 is greater than that of the layers disposed above it. With this multi-tiered or terraced configuration, for each multilayer structure MS1, MS2, the length of the peripheral edge portion of the bottommost layer is $11+12+13+14+15=12$; the length of the peripheral edge portion of the second layer 2 is L2−15; the length of the peripheral edge portion of the third layer 3 is L2−(15+14); the length of the peripheral edge portion of the fourth layer 4 is L2 −(13+14+15); and, the length of the peripheral edge portion of the uppermost layer 5 is L2−(12+13+14+15)=11. Thus, the difference between the peripheral edge portion length of the uppermost layer 5 and that of the fourth layer 4 is 12; the difference between the peripheral edge portion length of the fourth layer 4 and that of the third layer 3 is 13; the difference between the peripheral edge portion length of the third layer 3 and that of the second layer 2 is 14; and, the difference between the peripheral edge portion length of the second layer 2 and that of the bottommost layer 1 is 15. Preferably, the peripheral edge portion length differential between successive layers is constant (i.e. $12=13=14=15$), although this is certainly not limiting to the present invention. In an exemplary embodiment of this invention, the width L of the scribe line region SLR is 200 $\mu$m; the length L2 of the peripheral edge portion of the bottommost layer 1 of each multilayer structure MS1, MS2 is 30 $\mu$m; the length L1 of the uncovered, central bottom portion of the scribe line region SLR disposed between the adjacent, multilayer structures, MS1, MS2, is 140 μm; the length l1 of the peripheral edge portion of the uppermost layer 5 of each multilayer structure MS1, MS2 is 10 μm; and, l2=l3=l4=l5=l5=5 μm.

As is clearly evident from the foregoing, instead of the peripheral edge portion PE1, PE2 of each multilayer structure MS1, MS2, respectively, having a single vertical edge which lies in a common vertical plane, as is done in the prior art, in accordance with the present invention, the peripheral edge portion PE1, PE2 of each multilayer structure MS1, MS2, respectively, is tiered, thereby ensuring adequate step coverage of the photoresist film which is applied to the individual layers 1-5 when they are patterned during the wafer fabrication process.

With reference now to FIG. 3, there can be seen a second embodiment of the present invention. In this embodiment, it can be seen that the length of the peripheral edge portion of each individual layer 1-5 is less than that of the layers disposed above it. Preferably, as is shown in FIG. 3, the peripheral edge portion of each individual layer 1-5 completely overlies the peripheral edge portion of the layer disposed therebeneath, with each individual layer 1-5 having a distal foot portion 1a-5a, respectively, which extends beyond the distal foot portion of all of the layers disposed therebeneath, and which is disposed on the surface of the wafer 100. With the above-described structural configuration, the distal foot portions 1a-5a of the layers 1-5, respectively, are serially arranged on the surface of the wafer 100, with the distal foot portion 5a being the outermost one of the distal foot portions 1a-5a, and the distal foot portion 1a being the innermost one of the distal foot portions 1a-5a.

As is evident from FIG. 3 and the foregoing description thereof, in accordance with this embodiment of the present invention, the peripheral edge portions of the multilayer structures are also tiered, thereby ensuring adequate step coverage of the photoresist film which is applied to the individual layers 1-5 when they are patterned during the wafer fabrication process. Further, although the peripheral edge portions of the multilayer structures have a single vertical edge which lies in a common vertical plane, the height of this single vertical edge is equal to the thickness of only the uppermost layer 5, rather than the collective thicknesses of several of the layers, as is the case in the prior art, thereby further ensuring adequate step coverage of the photoresist film which is applied to the individual layers 1-5 when they are patterned during the wafer fabrication process.

With continuing reference to FIG. 3, it can further be seen that the length of the peripheral edge portion of the bottommost layer 1 is l1; the length of the peripheral edge portion of the second layer 2 is l1+l2; the length of the peripheral edge portion of the third layer 3 is l1+l2+l3; the length of the peripheral edge portion of the fourth layer 4 is l1+l2+l3+l4; and, the length of the peripheral edge portion of the uppermost layer 5 is l1+l2+l3+l4+l5. Thus, the difference between the peripheral edge portion length of the bottommost layer 1 and that of the second layer 2 is l2; the difference between the peripheral edge portion length of the second layer 2 and that of the third layer 3 is l3; the difference between the peripheral edge portion length of the third layer 3 and that of the fourth layer 4 is l4; and, the difference between the peripheral edge portion length of the fourth layer 4 and that of the uppermost layer 5 is l5. Preferably, the peripheral edge portion length differential between successive layers is constant (i.e. l2=l3=l4=l5), although this is certainly not limiting to the present invention. In an exemplary embodiment of this invention, l2=l3=l4−l5=5 μm.

With reference now to FIG. 4, there can be seen a third embodiment of the present invention. In this embodiment, the length of the peripheral edge portion of each of the odd-numbered layers 1, 3, 5 is greater than that of the other odd-numbered layers disposed thereabove, but less than that of the even-numbered layers 2, 4, 6. The length of the peripheral edge portion of each of the even-numbered layers 2, 4, 6 is less than that of the other even-numbered layers disposed thereabove. Preferably, as is shown in FIG. 4, the peripheral edge portion of each of the even-numbered layers 2, 4, 6 completely overlies the peripheral edge portion of the even-numbered layer disposed therebeneath, with each even-numbered layer 2, 4, 6 having a distal foot portion 2a, 4a, 6a, respectively, which extends beyond the distal foot portion of all of the even-numbered layers disposed therebeneath, and which is disposed on the surface of the water 100.

With continuing reference to FIG. 4, it can further be seen that the length of the peripheral edge portion of the uppermost odd-numbered layer 5 is l1; the length of the peripheral edge portion of the intermediate odd-numbered layer 3 is l1+l2; the length of the peripheral edge portion of the bottommost odd-numbered layer 1 is l1−l2−l3; the length of the peripheral edge portion of the bottommost even-numbered layer 2 is l1+l2+l3+l4; the length of the peripheral edge portion of the intermediate even-numbered layer 4 is l1+l2+l3+l4+l5; ad, the length of the uppermost even-numbered layer 5 is l1+l2+l3+l4+l5+l6. Thus, the difference between the peripheral edge portion length of the uppermost even-numbered layer 6 and that of the intermediate even-numbered layer 4 is l6; the difference between the peripheral edge portion length of the intermediate even-numbered layer 4 and that of the bottommost even-numbered layer 2 is l5; the difference between the peripheral edge portion length of the bottommost odd-numbered layer 1 and that of the intermediate odd-numbered layer 3 is l3; the difference between the peripheral edge portion length of the intermediate odd-numbered layer 3 and that of the uppermost odd-numbered layer 5 is l2; and, the difference between the peripheral edge portion length of the bottommost even-numbered layer 2 and that of the bottommost odd-numbered layer 1 is l4. Preferably, the peripheral edge portion length differential between successive, even-numbered layers is constant (i.e. l2=l3), and the peripheral edge portion length differential between successive, odd-numbered layers is constant (i.e. l4=l5=l6). In an exemplary embodiment of this invention, l1=20 μm; and, l2=l3=l4=l5=l6=5 μm, although these values are certainly not limiting to the present invention.

As is evident from FIG. 4 and the foregoing description thereof, in accordance with this embodiment of the present invention, the peripheral edge portions of the multilayer structures are also tiered, thereby ensuring adequate step coverage of the photoresist film which is applied to the individual layers 1-6 when they are patterned during the wafer fabrication process. Further, although the peripheral edge portions of the multilayer structures have a single vertical edge which lies in a common vertical plane, the height of this single vertical edge is equal to the thickness of only the uppermost even-numbered layer 6, rather than the collective thicknesses of several of the layers, as is the case in the prior art, thereby further ensuring adequate step coverage of the photoresist film which is applied to the individual layers 1–6 when they are patterned during the wafer fabrication process.

With reference now to FIG. 5, there can be seen a fourth embodiment of the present invention, which is essentially the same as the fourth embodiment of the present invention depicted in FIG. 4, except that the positions of the even-numbered layers and the odd-numbered layers are switched. Accordingly, the even-numbered layers 2, 4, 6 of the third embodiment correspond to the odd-numbered layers 1, 3, 5 of the fourth embodiment, and the odd-numbered layers 1, 3, 5 of the third embodiment correspond to the even-numbered layers 2, 4, 6 of the fourth embodiment.

Although several preferred embodiments of the present invention have been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A semiconductor wafer partitioned into a multiplicity of chip areas defined by a grid-like array of scribe lines inscribed into the surface of the wafer, wherein each scribe line is longitudinally bounded by respective field oxide layers formed in the surface of the wafer, to thereby define a scribe line region between adjacent chip areas, including;

a multiplicity of integrated circuits formed in a corresponding multiplicity of the chip areas, respectively, each of said integrated circuits including a patterned, multilayer structure having a peripheral edge portion which extends into a respective one of the scribe line regions;

wherein said peripheral edge portion of each said multilayer structure has a multi-tiered cross-sectional profile;

wherein each said multilayer structure is comprised of a plurality of individual layers each having a peripheral edge portion which extends into said respective one of the scribe line regions, wherein the length of said peripheral edge portion of each said individual layer is different; and, wherein, for each said multilayer structure, the length of said peripheral edge portion of each said individual layer is greater than that of the other ones of said individual layers disposed thereabove.

2. The wafer as set forth in claim 1, wherein, for each said multilayer structure, the difference in the length of said peripheral edge portion of successive ones of said individual layers is constant.

3. A semiconductor wafer partitioned into a multiplicity of chip areas defined by a grid-like array of scribe lines inscribed into the surface of the wafer, wherein each scribe line is longitudinally bounded by respective field oxide layers formed in the surface of the wafer, to thereby define a scribe line region between adjacent chip areas, including:

a multiplicity of integrated circuits formed in a corresponding multiplicity of the chip areas, respectively, each of said integrated circuits including a patterned, multilayer structure having a peripheral edge portion which extends into a respective one of the scribe line regions;

wherein said peripheral edge portion of each said multilayer structure has a multi-tiered cross-sectional profile;

wherein each said multilayer structure is comprised of a plurality of individual layers each having a peripheral edge portion which extends into said respective one of the scribe line regions, wherein the length of said peripheral edge portion of each said individual layer is different; and, wherein, for each said multilayer structure, the length of said peripheral edge portion of each said individual layer is less than that of the other ones of said individual layers disposed thereabove.

4. The wafer as set forth in claim 3, wherein, for each said multilayer structure, said peripheral edge portion of each said individual layer completely overlies said peripheral edge portion of the other ones of said individual layers disposed therebeneath.

5. The wafer as set forth in claim 4, wherein, for each said multilayer structure, each said individual layer has a distal foot portion disposed on the surface of the wafer, wherein said distal foot portion of each said individual layer extends beyond said distal foot portion of the other ones of said individual layers disposed therebeneath.

6. The wafer as set forth in claim 5, wherein, for each said multilayer structure, the difference in the length of said peripheral edge portion of successive ones of said individual layers is constant.

7. A semiconductor wafer partitioned into a multiplicity of chip areas defined by a grid-like array of scribe lines inscribed into the surface of the wafer, wherein each scribe line is longitudinally bounded by respective field oxide layers formed in the surface of the wafer, to thereby define a scribe line region between adjacent chip areas, including:

a multiplicity of integrated circuits formed in a corresponding multiplicity of the chip areas, respectively, each of said integrated circuits including a patterned, multilayer structure having a peripheral edge portion which extends into a respective one of the scribe line regions;

wherein said peripheral edge portion of each said multilayer structure has a multi-tiered cross-sectional profile;

wherein each said multilayer structure is comprised of a plurality of individual layers each having a peripheral edge portion which extends into said respective one of the scribe line regions, wherein the length of said peripheral edge portion of each said individual layer is different; and, wherein, for each said multilayer structure:

said plurality of individual layers include first alternate ones comprised of successive, alternate ones of said individual layers, beginning with the bottommost individual layer, and, second alternate ones comprised of successive, alternate ones of said individual layers, beginning with the next-to-bottommost individual layer;

the length of said peripheral edge portion of each said individual layer of said first alternate ones is greater than that of the other ones of said individual layers of said first alternate ones disposed thereabove; and, the length of said peripheral edge portion of each said individual layer of said second alternate ones is less than that of the other ones of said individual layers of said second alternate ones disposed thereabove.

8. The wafer as set forth in claim 7, wherein, for each said multilayer structure, each said individual layer of said second alternate ones has a distal foot portion disposed on the surface of the wafer, wherein said distal foot portion of each said individual layer of said second alternate ones extends beyond said distal foot portion of the other ones of said individual layers of said second alternate ones disposed therebeneath.

9. The wafer as set forth in claim 8, wherein, for each said multilayer structure, the difference in the length of said peripheral edge portion of successive ones of said individual layers of said second alternate ones is constant.

10. The wafer as set forth in claim 9, wherein, for each said multilayer structure, the difference in the length of said peripheral edge portion of successive ones of said individual layers of said first alternate ones is constant.

11. A semiconductor wafer partitioned into a multiplicity of chip areas defined by a grid-like array of scribe lines inscribed into the surface of the wafer, wherein each scribe line is longitudinally bounded by respective field oxide layers formed in the surface of the wafer, to thereby define a scribe line region between adjacent chip areas, including:
 a multiplicity of integrated circuits formed in a corresponding multiplicity of the chip areas, respectively, each of said integrated circuits including a patterned, multilayer structure having a peripheral edge portion which extends into a respective one of the scribe line regions;
 wherein said peripheral edge portion of each said multilayer structure has a multi-tiered cross-sectional profile;
 wherein each said multilayer structure is comprised of a plurality of individual layers each having a peripheral edge portion which extends into said respective one of the scribe line regions, wherein the length of said peripheral edge portion of each said individual layer is different; and,
 wherein, for each said multilayer structure:
  said plurality of individual layers include first alternate ones comprised of successive, alternate ones of said individual layers, beginning with the bottommost individual layer, and, second alternate ones comprised of successive, alternate ones of said individual layers, beginning with the next-to-bottommost individual layer;
  the length of said peripheral edge portion of each said individual layer of said first alternate ones is less than that of the other ones of said individual layers of said first alternate ones disposed thereabove; and,
  the length of said peripheral edge portion of each said individual layer of said second alternate ones is greater than that of the other ones of said individual layers of said second alternate ones disposed thereabove.

12. The wafer as set forth in claim 11, wherein, for each said multilayer structure, each said individual layer of said first alternate ones has a distal foot portion disposed on the surface of the wafer, wherein said distal foot portion of each said individual layer of said first alternate ones extends beyond said distal foot portion of the other ones of said individual layers of said first alternate ones disposed therebeneath.

13. The wafer as set forth in claim 12, wherein, for each said multilayer structure, the difference in the length of said peripheral edge portion of successive ones of said individual layers of said first alternate ones is constant.

14. The wafer as set forth in claim 13, wherein, for each said multilayer structure, the difference in the length of said peripheral edge portion of successive ones of said individual layers of said second alternate ones is constant.

* * * * *